(12) United States Patent
Vlasenko

(10) Patent No.: US 6,665,220 B2
(45) Date of Patent: Dec. 16, 2003

(54) COLUMN REDUNDANCY FOR CONTENT ADDRESSABLE MEMORY

(75) Inventor: Peter Vlasenko, Ottawa (CA)

(73) Assignee: Mosaid Technologies Incorporated, Kanata (CA)

(*) Notice: Subject to any disclaimer, the term of this patent is extended or adjusted under 35 U.S.C. 154(b) by 0 days.

(21) Appl. No.: 10/173,504

(22) Filed: Jun. 18, 2002

(65) Prior Publication Data
US 2003/0081464 A1 May 1, 2003

(30) Foreign Application Priority Data
Oct. 31, 2001 (CA) .......................................... 2,360,897

(51) Int. Cl.[7] ............................................. G11C 7/00
(52) U.S. Cl. ...................... 365/200; 365/49; 365/189.07
(58) Field of Search ....................... 365/200, 49, 230.03, 365/189.07, 168

(56) References Cited

U.S. PATENT DOCUMENTS

| | | | |
|---|---|---|---|
| 5,204,836 A | | 4/1993 | Reed |
| 5,347,484 A | * | 9/1994 | Kwong et al. ................. 365/49 |
| 5,438,546 A | * | 8/1995 | Ishac et al. .................. 365/200 |
| 5,796,662 A | * | 8/1998 | Kalter et al. ................. 365/200 |
| 6,144,591 A | | 11/2000 | Vlasenko et al. |
| 6,249,467 B1 | * | 6/2001 | Pereira et al. ............... 365/200 |
| 6,373,739 B1 | * | 4/2002 | Lien et al. ..................... 365/49 |
| 6,397,313 B1 | * | 5/2002 | Kasa et al. .................. 711/168 |

FOREIGN PATENT DOCUMENTS

| | | |
|---|---|---|
| DE | 100 07 604 | 8/2001 |
| EP | 0 559 368 | 9/1993 |
| EP | 0 901 130 | 3/1999 |
| WO | WO 00/50996 | 8/2000 |

OTHER PUBLICATIONS

Yamagata, T. et al, "A Bitline Control Circuit Scheme and Redundancy Technique for High-Density Dynamic Content Addressable Memories", IEICE Transactions on Electronics, Institute of Electronics Information and Comm. Eng., Tokyo, JP, vol. E76-C, No. 11, Nov. 1, 1993, pp. 1657-1664, XP000424605, ISSN: 0916-8524.

* cited by examiner

Primary Examiner—David Nelms
Assistant Examiner—Gene N. Auduong
(74) Attorney, Agent, or Firm—L. Anne Kinsman; Borden, Ladner, Gervais, LLP

(57) ABSTRACT

A system for adding redundancy to the data path of a content addressable memory array is disclosed herein. The disclosed system employs an array of memory elements, supplemented by an array of redundant memory elements, with a switching system and a redundancy control system to ensure that defective memory elements are not accessed. Additionally a pull down unit is employed on the search lines of non-operative memory elements to ensure that inaccurate search results are not reported.

6 Claims, 8 Drawing Sheets

COLUMN REDUNDANCY FOR CONTENT ADDRESSABLE MEMORY

This application claims priority from Canadian Patent Application No. 2,360,897, filed Oct. 31, 2001.

FIELD OF THE INVENTION

The present invention relates to a method and apparatus for replacing defective elements with spare elements in an integrated circuit chip. More specifically, the present invention relates to implementing redundancy in a Content Addressable Memory (CAM).

BACKGROUND OF THE INVENTION

In the manufacture of memory systems for packaging in integrated circuit packages, a series of repetitive memory blocks is produced on a wafer. Each memory block is comprised of a number of memory elements. As a result of imperfections in the manufacturing process and in the materials used, it is not uncommon for memory elements in the memory blocks to be defective. If a block contains a defective memory element it is unable to be reliably accessed by the memory subsystem, thus the memory element must be either discarded or repaired to allow for reliable use of all accessible memory elements. While single, isolated memory element failures may be spread throughout the array, very often, multiple memory elements in the same vicinity fail. Since multi-memory element failures occur in the same vicinity, a column containing at least one faulty element is usually deemed to be defective and will have to be somehow replaced with a functional row or column.

Row and/or column redundancy is used in most semiconductor memory devices to address the problem of defective memory elements. The most common implementation of redundancy is column redundancy, which provides an on-chip system for replacing a predetermined number faulty columns with functional columns, thereby allowing the repair of defective memory elements. Typically, redundant elements are placed adjacent to the normal elements in the array, so these redundant elements and the associated control circuitry occupy additional silicon area adjacent to the area occupied by the normal memory elements and their associated control circuits. Increasing the number of redundant elements increases the yield of the manufacturing process, at the expense of more costly circuits and increased circuit area. As a result, a trade-off exists between the number of redundant elements to provide on the chip and the overall chip area.

The addition of redundant memory elements in order to improve IC yield in the manufacturing process for Random Access Memory (RAM) is known. Very often, chips with defective memory elements can be repaired prior to being packaged. Once identified, defective memory elements can be replaced with spare memory elements, usually by programming the faulty address or addresses into fuse banks, or other types of non-volatile memory, which then re-route the address or data path from a normal path to a redundant path. For example, in a given block of RAM on a wafer there are a number of identical memory elements. If one memory element is found to be defective, the faulty address is programmed into an on-chip fuse programming circuit, and all normal address or data path connections to that memory element are routed to a redundant memory element. Though this technique is incapable of guaranteeing a 100% yield, it is known to dramatically increase the yield with a limited number of redundant memory elements. The increase in yield is proportional, but not linearly related, to the number of redundant memory elements provided.

Many implementations of redundancy have been applied to the production of RAM. One such example, for use with RAMs with very wide data bus widths (for example 128 bits), is U.S. Pat. No. 5,796,662, entitled "Integrated circuit chip with a wide I/O memory array and redundant data lines", to Kalter et al. This patent teaches a bit-shift redundancy system which includes a data word input block for switching defective elements out of the data path, thereby steering data destined for the defective elements bits either to left or right adjacent elements, as well as an output shift block to shift the non-defective bits back into position. In this manner, the data bit order is maintained even after a defective element has been replaced. The input and output shift blocks are comprised of three-way CMOS switches which selectively steer data through either one of the three possible paths associated with each switch. This provides a column redundancy system which effectively bypasses defective elements, and replaces them with identical adjacent elements rather than replacing defective elements with redundant elements which may have a different activation time than the activation time of normal elements. The problem with this approach is that each time a defective address is specified, the entire data word must be shifted over by one or more bit positions in order to avoid the defective column and then, the entire word has to be re-shifted back into position in order to maintain the overall bit order. This requires two sets of three-way switches associated with each bit in the data word and requires a lot of area. In addition, the adjacent shifting of elements to the right or left of defective elements and then the subsequent re-shifting back into position of the non-defective elements introduces a propagation delay in the data path.

Although the use of redundancy in content addressable memories (CAM) has been proposed, its use is more limited than in commodity RAMs. Row redundancy schemes for CAM have been proposed but column redundancy is more challenging. Conventional column decoding used in DRAMs where wherein a small group or a single column is selected by a column decoder does not readily apply to CAMs having very wide word width. In such cases, redundancy based on column addressing is not effective since individual bits within a very wide word cannot be individually addressed. As a result, some type of data steering is preferable in attempting to implement column redundancy in CAMS. Furthermore for CAMs employing separate search and data paths, the implementation of redundancy becomes even more challenging since any changes in the data path must be correlated with associated changes in the search path. For example, the search path may allow searching of the entire CAM simultaneously whereas the read/write data path typically can only access a subset of the entire CAM at any one time. This simultaneous search and read/write access is difficult to implement if for example a programmable register were used to track defective memory elements and the associated replacement element since any coding or scrambling of the defective cell information has to be performed in both the data (and/or address) path as well as in the search path.

Another factor complicating the implementation of redundancy in the context of CAMs is that the search line is typically connected to multiple other CAM elements, and each CAM element contributes a known parasitic capacitance to the search line (it will be readily understood by one skilled in the art that although we refer to a search line being connected to a memory element, in the case of ternary content addressable memory there is in fact typically a pair of search lines connected to each ternary memory cell in order to allow ternary data storage as well as search and compare capability). The magnitude of the parasitic capacitance contributed to the search line is crucial to the timing of memory operations, since the higher the parasitic capacitance of the search line, the longer it takes to switch the search line from one logic state to another.

Additionally it is possible that each CAM element imposes a different parasitic capacitance on the search line. A defective CAM column that is replaced, cannot simply be ignored by severing a search line because the parasitic capacitance of the local search line attached to the CAM column is essential to the proper operation of the global search line. Additionally it is not possible to leave the search line intact and ignore it, as the search line may take on a value that results in erroneous results on the memory system's search line.

U.S. Pat. No. 6,249,467 to Pereira et al. discloses a row redundancy system for a CAM, wherein defective rows in a CAM block can be functionally replaced by spare rows available in the same block or in any block on the device. Every CAM block includes a CAM memory array having a plurality of CAM cells, each CAM cell coupled to a word (data) line and a match line, and a spare row of CAM cells each CAM cell in the spare row being connected to a spare word line and a spare match line. Each spare row may be used to functionally replace a defective row in the same block or in any other block by programming the address of the defective row into the address decoder. Pereira suggests using a multiplexer to provide a redundant address to a main address decoder during a rest pulse and providing a normal address to the main address decoder after the reset pulse. During the reset pulse, matchlines are precharged using a latch on each word line. In case a word line is found to be defective, the associated matchline is prechard to a "don't care" state which is not changed once the reset pulse has completed. A spare word line and associated match line at the edge of the array is then used to replace the defective word line. In addition, the defective address information is also provided to circuitry associated with the priority encoding of match lines to indicate which match line was replaced and ensure proper address priority. This approach essentially resembles row redundancy systems used in conventional DRAM with the additional component that match lines are controlled by results of the row redundancy addressing mechanism. Redundant row addresses are used to enable and disable defective and spare rows and the associated match lines are controlled accordingly. However, in content addressable memory, column redundancy cannot be solely controlled by addressing replacement since each CAM word consists of a very large number of bits which are not selected by column decoding as is the case in conventional DRAMs. As a result, this type of row redundancy cannot be directly implemented to achieve column redundancy in a CAM context.

It is, therefore, desirable to provide a method and system for providing redundancy capability for a CAM that minimizes additional circuit area and ensures rapid normal and redundant memory element operation.

SUMMARY OF THE INVENTION

It is an object of the present invention to provide a redundancy scheme in a content addressable memory system with a minimum influence in its search performance. Another object of the present invention is to provide a content addressable memory having an efficient datapath redundancy with a minimum area required for its implementation. It is a further object of the invention to provide a redundancy system for a content addressable memory, capable of correcting more than one defective element within a memory segment.

In a first aspect of the present invention there is provided a content addressable memory having a column redundancy system for replacing defective memory elements with redundant memory elements, said content addressable memory being segmented into a plurality of memory arrays, each of said memory arrays comprising a plurality of columns of memory elements, a predetermined number of redundant columns of memory elements, a local search data path comprising a plurality of local search data lines coupled to said columns of memory elements, a local read/write data path comprising a plurality of local read/write data lines coupled to said memory elements, a redundancy control block, and a switching block for selectively coupling said local search data path and said local read/write data path to respective global search data path and global read/write data path in response control signals provided by said redundancy control block, said switching block switching global data destined for an associated local data path to an adjacent local data path in the event a defective column is detected.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Generally, the present invention provides a method and system for implementing redundancy in a content addressable memory array by logically replacing defective memory elements with redundant memory elements. The ensuing discussion details an embodiment of the present invention wherein the content addressable memory array has ternary data signals, and ternary data states. The present invention is not, however restricted to ternary systems. The present invention can easily be applied, as one of skill in the art can readily see, to systems that are based on a binary data signal. The presence of a pull down unit (PDU), described below, is generally applicable to any redundant memory system where searches of memory elements are performed, and it is desirable to prevent inaccurate search results based upon the unexpected content of unused or non-operative memory elements.

Figure 1:
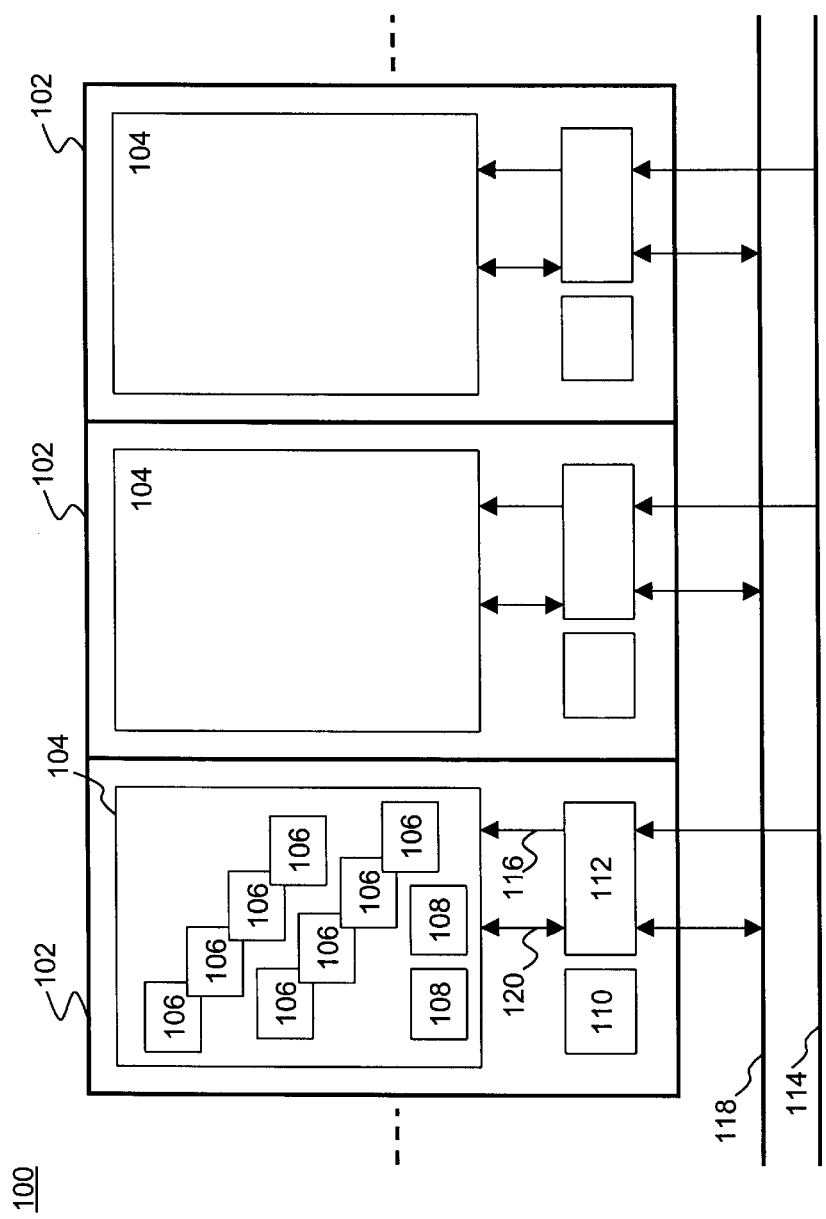
FIG. 1 is a schematic block diagram of a memory array according to the present invention.

FIG. 1 illustrates an exemplary CAM array 100, comprised of a series of identically configured blocks 102. Each block 102 includes a memory array segment 104 and a redundancy control block (RCB) 110 and switching circuitry 112. Memory array segment 104 comprises normal and redundant memory elements, 106 and 108 respectively. It should be noted that in FIG. 1, the normal and redundant memory elements are only shown conceptually and not to scale or indicative of actual location; it is known by those skilled in the art that redundant elements are usually physically located at edges of an array of normal memory elements. The ratio of conventional elements 106 to redundant elements 108 can be varied to meet design constraints regarding coverage, size, cost, and other factors that would be apparent to one skilled in the art. Each memory element 106 within each segment 104 is connected to switching circuitry 112 in the same manner (which will be discussed in detail later), so that the conventional and redundant memory elements 106 and 108 are logically identical, and exhibit the same switching delay characteristics. Switching circuitry 112 connects a global search line 114 to a local search line 116, and a global data line 118 to a local data line 120. Although only one global and local search and data line are shown, it will be appreciated that multiple lines are used to implement multibit data transfer. The global and local search lines 114, 116, in combination, are referred to as the search path, whereas the global and local data lines 118, 120, in combination, are referred to as the data path. The redundancy control block 110 contains redundant address fuse programming circuitry as well as control logic which controls the operation of switching unit 112. As can be seen every configured block 102 has its own complete redundancy system including programming circuitry and decoding logic. As a result, each block 102 can have a certain number of defective memory elements replaced by the redundancy control block 110 local to that block 102. It should be noted that by providing a dedicated redundancy control block 110 and switching circuitry 112 for each block 102, synchronization of switching of search and read/write data is achieved. Furthermore, the sharing of switching circuitry between search and read/write data paths provides for a savings in silicon area.

In terms of general operation of the elements of FIG. 1, in case no defective memory elements are found in the integrated circuit during pre-packaging testing the redundancy control block 110 does not interfere with the normal transfer of search and read/write data between global and local search and data lines. In case defective memory elements are found during testing, the redundancy control block 110 redirects read/write and search data destined for the defective element(s) to non-defective element(s) as will be described in more detail below.

Figure 2:
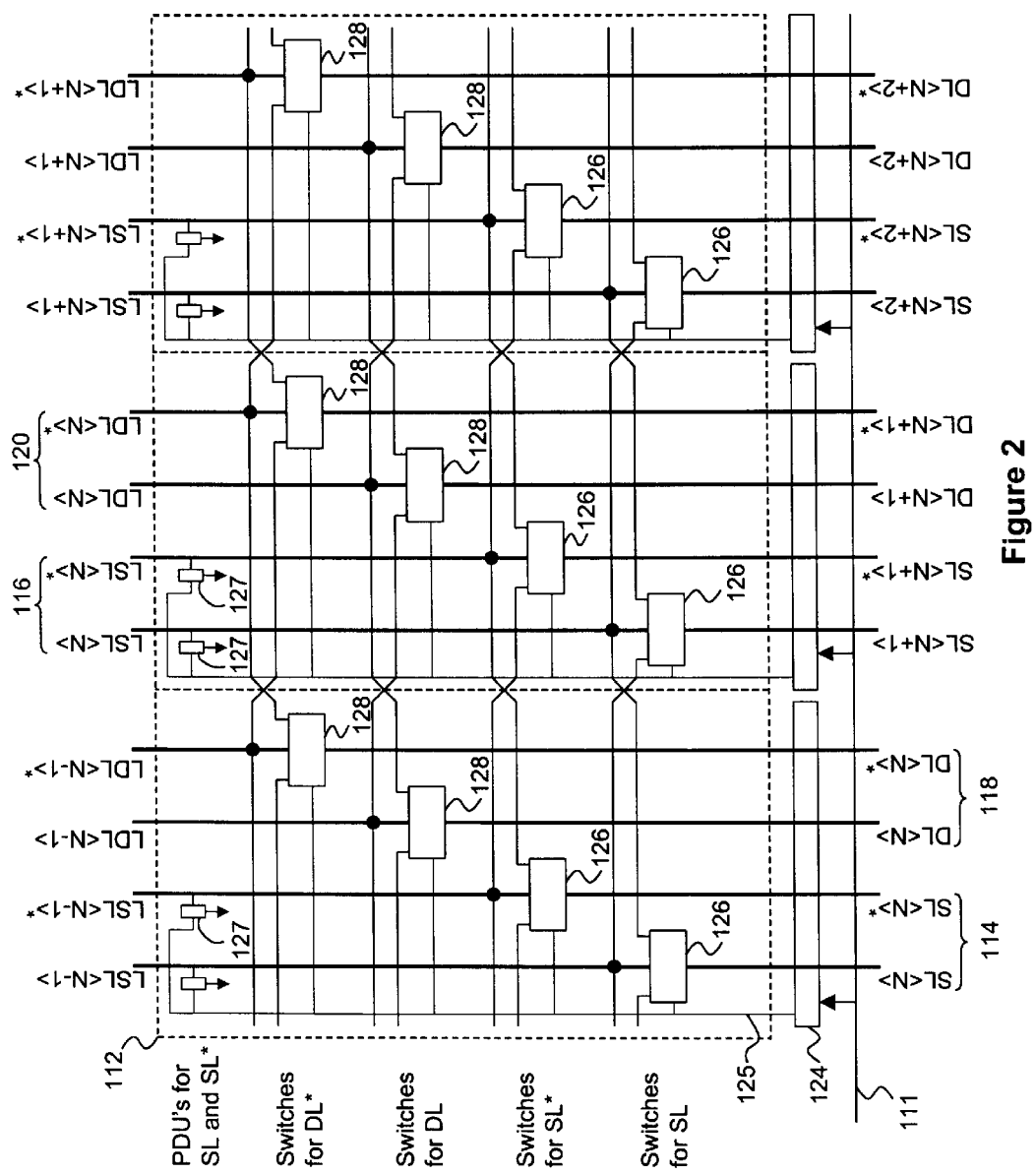
FIG. 2 is a schematic diagram illustrating search line and data line switching circuitry according to an embodiment of the invention.

FIG. 2 illustrates the switching circuitry 112 in more detail and how individual switches are interconnected. In FIG. 2, the search path (for the N-th bit of data for example) is defined as the path along the global search line pair 114 SL<N> and SL<N>*, passing through the switch elements 126 (described in more detail in FIG. 7) and continuing along the local search line pair 116 LSL<N> and LSL<N>*. As can be seen, the local search path for bit N is located in the adjacent switching circuitry area 112 immediately to the right of the switching area 112 where the global search path for bit N is connected. Similarly the data path is defined as the path along the global data line pair 118 DL<N> and DL<N>*, passing through the switch elements 128 and continuing along the local data line pair 120 LDL<N> and LDL<N>*. It should be noted that in the case of ternary data support, search data on SL<N> and SL<N>* and read/write data on the global and local search line pair might not be complementary. According to the embodiment shown in FIG. 2 of the invention, two redundant columns are located on the leftmost edge of a memory array 104 and as a result, local search and data lines are immediately to the right of global search and data lines for each respective bit position. Scenarios having redundant elements at both ends of a memory array or on the rightmost edge of the array are also possible.

As can be seen in FIG. 2, each switching circuit block 112 has two search line switches 126, two read/write data line switches and two pull-down units 127 for each search line. Looking at the N-th bit position for example, switching element 126 switch global search data on SL<N> to three possible paths depending on a control signal input 125. Search data on SL<N> can be switched either to the right to LSL<N>, straight through to LSL<N−1> or to the left to LSL<N−2> (not shown in FIG. 2). The other switch element 126 provides the same path selection for global search line SL<N>*. Similarly, read/write data line switches 128 provide local data line selection for the global data lines DL<N> and DL<N>*. As previously mentioned, in a preferred embodiment, all redundant elements are located at the leftmost edge of a memory array and therefore, the normal state of the switches 126 and 128 is to direct data on the global search and read/write data lines to the right.

The path onto which search or read/write data is to be routed is dependant on redundancy information provided redundancy switching control signal 125 (a multibit signal) which is generated by a redundancy decoder block 124. The redundancy decoder block 124 receives redundancy control information from redundancy control block signal 111 which is generated by the redundancy control block 110 (FIG. 1). The redundancy switching signal 125 provides control information to the search line switches 126, to the data line switches 128 and to the pull-down units 127 for selectively pulling to ground voltage any search lines that have been disabled as a result of detecting a fault during testing. As can be seen in FIG. 2, each set of search and read/write data lines have their own dedicated switches 126, 128 and pull-down units (for search lines) 127. Pull-down units are only necessary for defective search lines since defective search lines must be disabled and the must provide a "don't care" result in order to not interfere with overall result of a search operation. Defective data lines on the other hand do not impact other non-defective data lines and as a result, can remain floating once they have been switched out of the data path. Pull-down units could be also placed on defective data lines to avoid the floating data lines from possibly impacting other adjacent lines through parasitic capacitance effects, however, the additional area required to provide these additional data path pull-down units would not warrant their inclusion. These switches are carefully laid out on the integrated chip to fit within the local search line and local read/write data line pitch, i.e. the overall width taken up by each search and data line. This is important for minimizing silicon area associated with redundancy on the CAM.

Figure 3A:
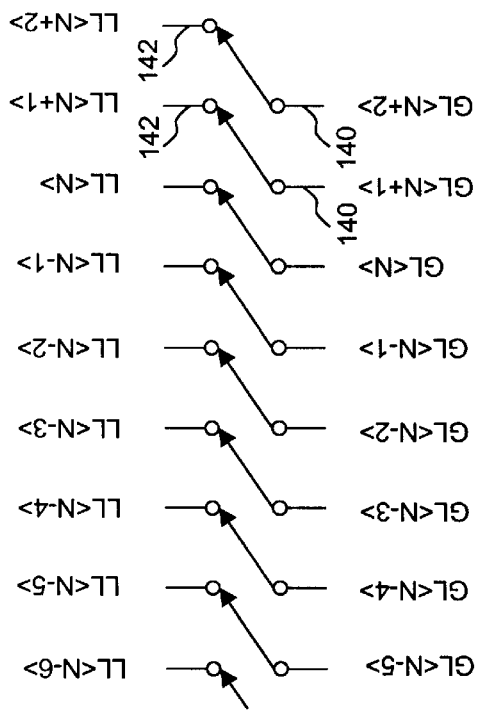
FIG. 3a is a conceptual illustration of an implementation of the switching circuitry of FIG. 2 for the case when there are no defective memory elements.
Figure 3A:
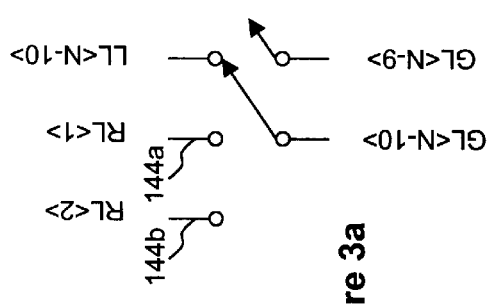
Figure 3B:
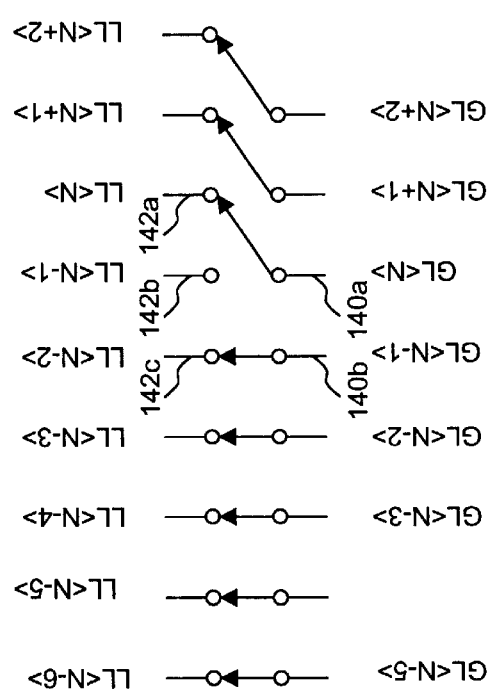
FIG. 3b is a conceptual illustration of an implementation of the switching circuitry of FIG. 2 for the case when there is one defective element.
Figure 3B:
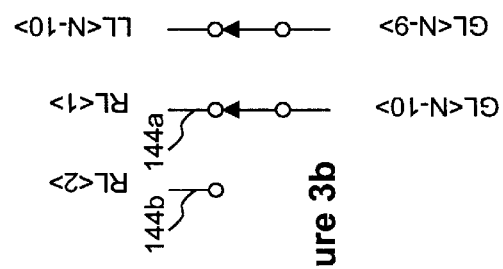
Figure 3C:
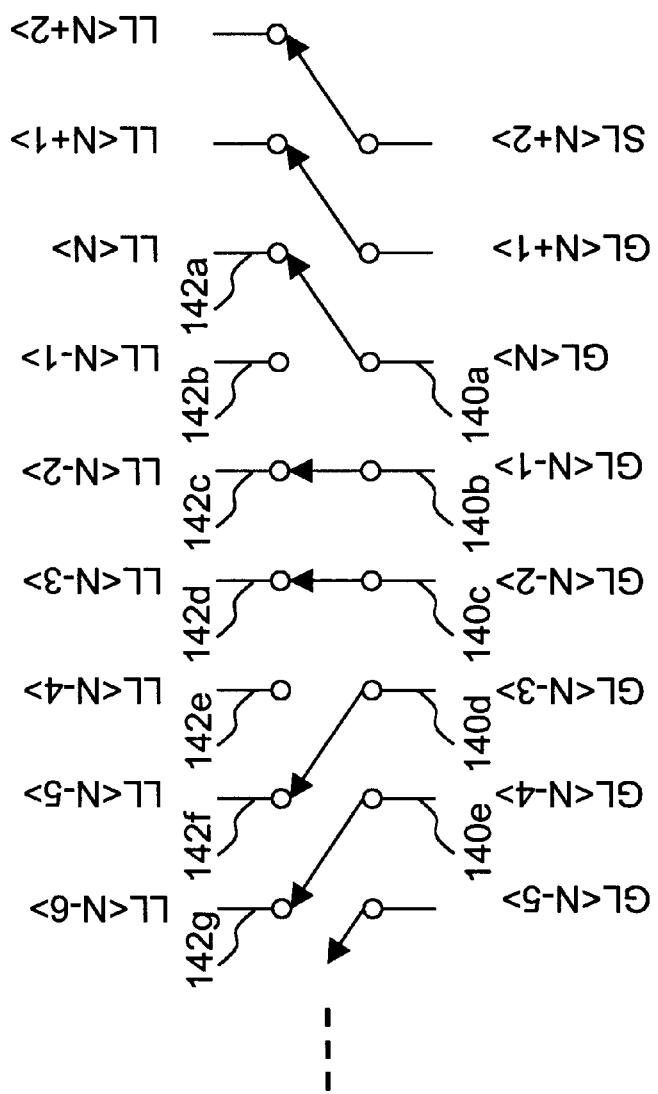
FIG. 3c is a conceptual illustration of an implementation of the switching circuitry of FIG. 2 for the case when there are two defective elements.
Figure 3C:
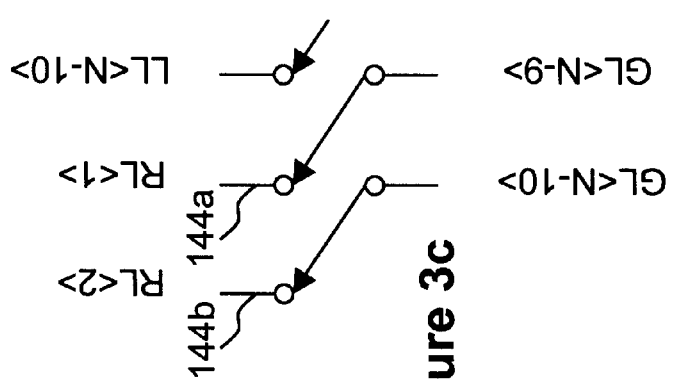

FIG. 3 illustrates at least 3 possible configurations for applying the present redundancy system to a CAM, first showing the configuration when there are no defective elements present in a memory segment, illustrated in FIG. 3a, when there is a defective element, illustrated in FIGS. 3b and c) when there are two defective elements present in a memory segment, illustrated in FIG. 3c.

According to the present embodiment, global search and read/write data lines are represented with the numeral 140 shown as global lines GL for general explanation purposes, and all the local search and read/write data lines are resented by numeral 142 shown as local lines LL for explanation purposes. In the present embodiment there are shown only two redundant memory elements associated with redundant search and data lines RL<1> 144a and RL<2>144b, but it is to be understood that one or more than two redundant memory elements can be provided for any particular memory segment.

FIG. 3a illustrates the case when there is no defective element found on the memory segment during testing. In this particular case, all the switches connecting global lines GL 140 remain switched to the right, connected to the local lines LL 142, leaving redundant elements RL<1> 144a and RL<2> 144b disabled. In this case, no fuse in the set of fuses in the redundant control block 110 is blown and thus, the switches 126 and 128 remain in their normal state, i.e. switching to the right.

FIG. 3b illustrates the case when only one defective element is found within that particular memory block, here defined as to be an element associated with local search and data line 142b LL<N–1>. If a memory element associated with local search and data line 142b LL<N–1>, normally connected to 140b GL<N–1>, is determined to be defective, then the switches 126 and 128 direct any search or read/write data respectively to an adjacent memory element associated with local search and data line 142c LL<N–2> one position to the left. All remaining connections between global and local lines to the left of the defective line are also directed to adjacent lines to the left. Essentially, in the illustrated embodiment of FIG. 3b, a shift-correction is employed, wherein a defective memory line 142b LL<N–1> is detected, and to overcome the defect, data on all memory lines to the left of 142b LL<N–1> is logically shifted to the left one position. As all data on lines to the left of 142b LL<N–1> is logically shifted left, redundant memory line 144a RL<1> is used to provide the data path for the last line. Redundant memory line 144b RL<2> is not needed to replace a defective element, so it remains unused. Both redundant memory line 144b RL<2> and defective memory line 142b LL<N–1> are defined herein as non-operative memory column lines as they are unused during the operation of the array 100. Conversely, the remaining memory lines are defined herein as operative memory column lines. In the case that the non-operative memory lines are search lines, their respective PDUs 127 that are attached to the local search lines 116 SL, are activated to ensure that the non-operative local search lines are connected to ground and do not remain floating. Each PDU 127 ensures that any search request to a non-operative memory line receives a reply with a predetermined signal. For example, with the PDU 127 being activated, the local search line 116 SL provides a "don't care" search result. This is critical for proper search operations because if even one bit reports incorrect data, the entire search will be affected; by providing a "don't care" result of the defective search line, the remainder of the search operation will not be impacted. The PDU 127 allows the local search lines 116 SL to be disabled, thereby ensuring a known parasitic capacitance on the local search lines 116 SL. The known parasitic capacitance on the search lines ensures the CAM system has optimized memory access timing. Additionally, the use of pull-down units 127 for defective local search lines guarantees that the defective search lines do not report inaccurate search results. As previously mentioned, in case the defective lines are data lines, no pull-down units are necessary. FIG. 3c illustrates the case where two defective lines 142b LL<N–1> and 142e LL<N–4> are found in a memory segment—note that the two defective lines are not adjacent to each other. Even though in this illustration both defective lines 142b LL<N–1> and 142e LL<N–4> are separated by non-defective elements 142c LL<N–2> and 142d LL<N–3>, there is of course the possibility of finding that the defective elements are located one beside the other. In any case, the redundancy system described can correct one or two defective memory lines within a memory segment regardless of their position.

In FIG. 3c, a memory element on line 142b LL<N–1> is one defective element found in the array. As previously mentioned with reference to FIG. 3a, data on the operative memory lines to the right of the defective line 142b LL<N–1> remains switched to the right, i.e. the global line 140a GL<N> remains connected to local line 142a LL<N>. In the case of the first defective line 142b LL<N–1>, data associated with global line 140b GL<N–1> is switched one position to the left and connected to local line 142c LL<N–2>. Data on all operative lines to the left of the first defective line and up to the next defective line is connected to the lines immediately in front. For example, since line 142d LL<N–3> is a non-defective element, its associated is connected directly ahead to global line 140c GL<N–2 >.

Also in FIG. 3c, line 142e LL<N–4> is found to be a second defective line, and as a result, switches 126 redirect data on the remaining global lines one position to the left of 142e LL<N–4>, i.e. connecting element 140d GL<N–3> to 142f LL<N–5>. Data on all the remaining lines to the left of 142e LL<N–4> is therefore shifted two positions left of their original non-defective position. In this case, both redundant lines 144a RL<1> and 144b RL<2> are used to replace two defective memory lines and provide the two non-defective lines. It should be noted that the redundancy system described according to the invention uses a shifting-correction mechanism, whereby faulty search or data lines are replaced with adjacent elements in the immediate vicinity of the defective line and the last line at the edge of a memory segment is shifted to a redundant . In other words, defective elements within the array are not replaced with a redundant element on the edge of a memory segment as in most prior art approaches wherein addressing and data transfer to and from the redundant element may have different timing than accessing a normal element within the array. By employing the shifting correction scheme described, any timing mismatch between accessing defective or non-defective lines will be minimized.

A further scenario (not shown in FIGS. 3a, 3b or 3c) in which an embodiment of the present invention can be applied is if redundancy lines 144a RL<1> and 144b RL<2> are located at the left and right extremes of the memory segment 104. In this case, data associated with global search and data lines is normally connected by switches 126 to local search and data lines directly ahead as opposed to being connected to local lines one position to the right as shown in FIG. 3a. In case two defective lines are detected during testing, the connections of lines to the right of the first defective element are shifted to the right one position and connections of lines to the left of the first defective element are shifted to the left one position. The resulting connections will resemble the connections shown in FIG. 3c with the exception that the left and right most lines will be redundant lines.

Figure 4:
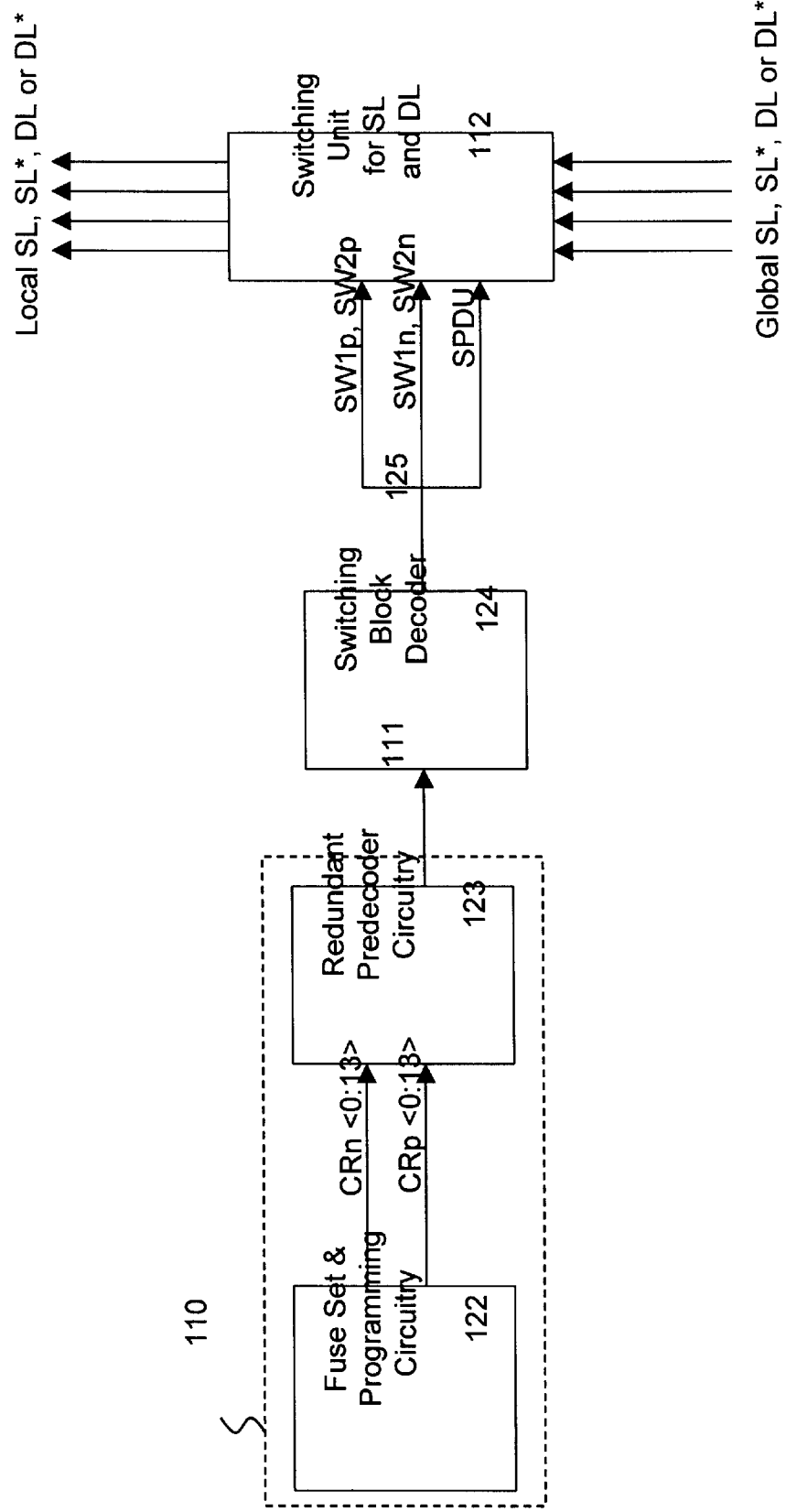
FIG. 4 is a block diagram of the redundant components of the invention.

FIG. 4 illustrates a block diagram of the circuit elements used to implement a preferred embodiment of the invention. FIG. 4 includes the redundancy control block 110, a switching block decoder 124 and the search and read/write data line switching unit 112. As previously mentioned, all of the blocks shown in FIG. 4 reside within one memory segment 102 thereby providing each such memory segment 102 with a complete redundancy system. Redundancy control block 110 includes a set of redundant programming fuses 122 and redundant predecoder circuitry 123. The set of fuses 122 provides the redundant address information to the redundant predecoder circuitry 123 which in turn provides redundant predecoding signals 111 to the switching block decoder 124.

According to this embodiment of the invention, only the switching unit 112 resides between the local and global search and data lines allowing for rapid access to the memory elements without causing significant delays. The switching unit 112 consists of groups of individual switches 126, and 128, as well as pull-down units PDU's 127 associated with local search lines, as shown in FIG. 2. The number of switches 126 and 128 per bit controlled by the logic block 124 is a design trade-off between redundancy coverage and chip area among other considerations. As shown in FIG. 2, the switching block decoder 124 and the switching unit 112 are both located in the pitch-matched area of the memory segment 102, with the switching unit 112 being shared by both the search and data path. This provides a savings in chip area which is essential in CAM due to the tight pitch of each column within a memory segment.

Figure 5:
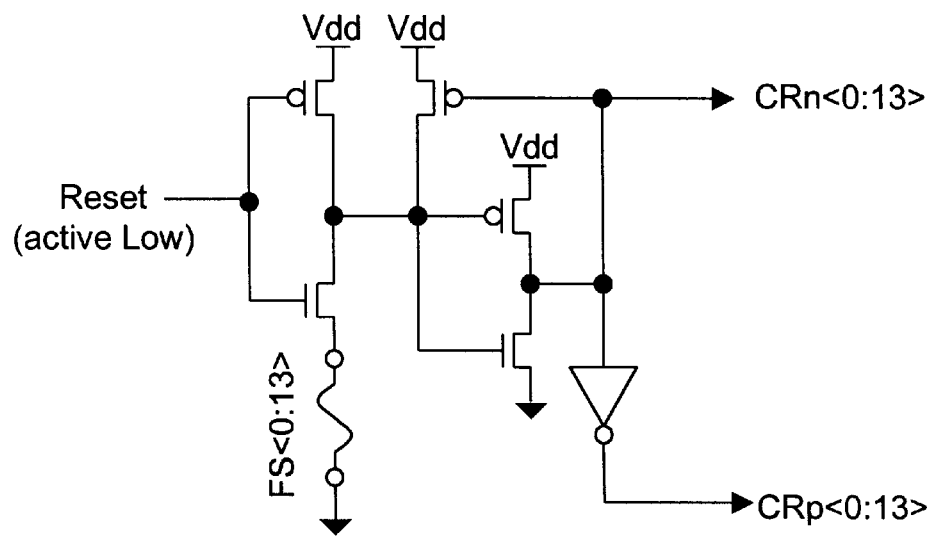
FIG. 5 is a schematic diagram of a bank of fuses used for programming redundant addresses according to the present invention.

FIG. 5 shows a detailed embodiment of the programming fuses 122 and its associated programming circuitry. The fuse circuitry includes a programming stage comprising a PMOS and NMOS transistor connected in series with a laser fuse element between a power supply and ground, a latching stage comprising a CMOS half-latch, and a driving stage comprising a CMOS inverter. The fuse circuitry is a conventional fuse latch circuit which outputs two complementary redundant address signals CRn<0:13> and CRp<0:13>. An active logic low reset pulse set once on power-up of the integrated circuit enables the fuse circuitry. In the case no defective element for a particular memory segment is found, the fuses are not blown and in the case that defective elements are found, then fuses are blown according to the corresponding address. In operation with the fuse not blown, prior to the reset pulse being pulled logic low, a logic high at the gate of the PMOS transistor in the programming stage will produce a logic low output from the programming stage which is used as an input to the latching stage. With a logic low input into the latching stage, that stage will produce a logic high signal on CRn<0:13> and a logic low on CRp<0:13>. When the reset pulse is pulled low, the programming stage will output a logic high, which in turn will generate a logic low on CRn<0:13> and a logic high on CRp<0:13>. Then on the rising edge of the reset pulse the state of the fuse is evaluated. In case the fuse is not blown, once the reset pulse is asserted high, since there is a path to ground in the programming stage, the output of the programming stage will be pulled to logic low and the output of the latching stage will be logic high i.e. logic high on CRn<0:13> and logic low on CRp<0:13>, indicating the redundant address is not active. If the fuse is blown, when the reset signal rises, since there is no path to ground in the programming stage, the output of the programming stage remains logic high, thereby maintaining a logic low on CRn<0:13> and a logic high on CRp<0:13> which indicate that the redundant address is active.

In the example here described, 14 fuses are required to provide the proper binary information to program two address changes and replace two conventional elements with up to two redundant elements, in a 108 bit CAM (having 108 conventional elements +2 redundant elements). It is to be understood that the number of fuses required for programming the address of the faulty elements change according to the redundant elements provided and the number of conventional elements comprised in the memory segment 104 that is covered. For this case, the circuitry described in FIG. 5 requires fourteen fuse circuits in order to generate redundant addresses CRn<0:13> and CRp<0:13> respectively. In this case, a first group of 7 fuses from FS<0> to FS<6>, are used to address the first faulty element and a second group comprising fuses FS<7:13> is used only if a second faulty element is present in the memory segment 104. The binary address of a defective memory element is programmed by blowing the corresponding fuses, in a manner common in the art, and the 14 pairs of redundant address signals CRn<0:13> and CRp<0:13> are sent to the redundant predecoder circuitry 123. It should be understood that another type of fuse programming circuit can be used to define defective memory addresses without departing from the spirit of the invention.

Figure 6:
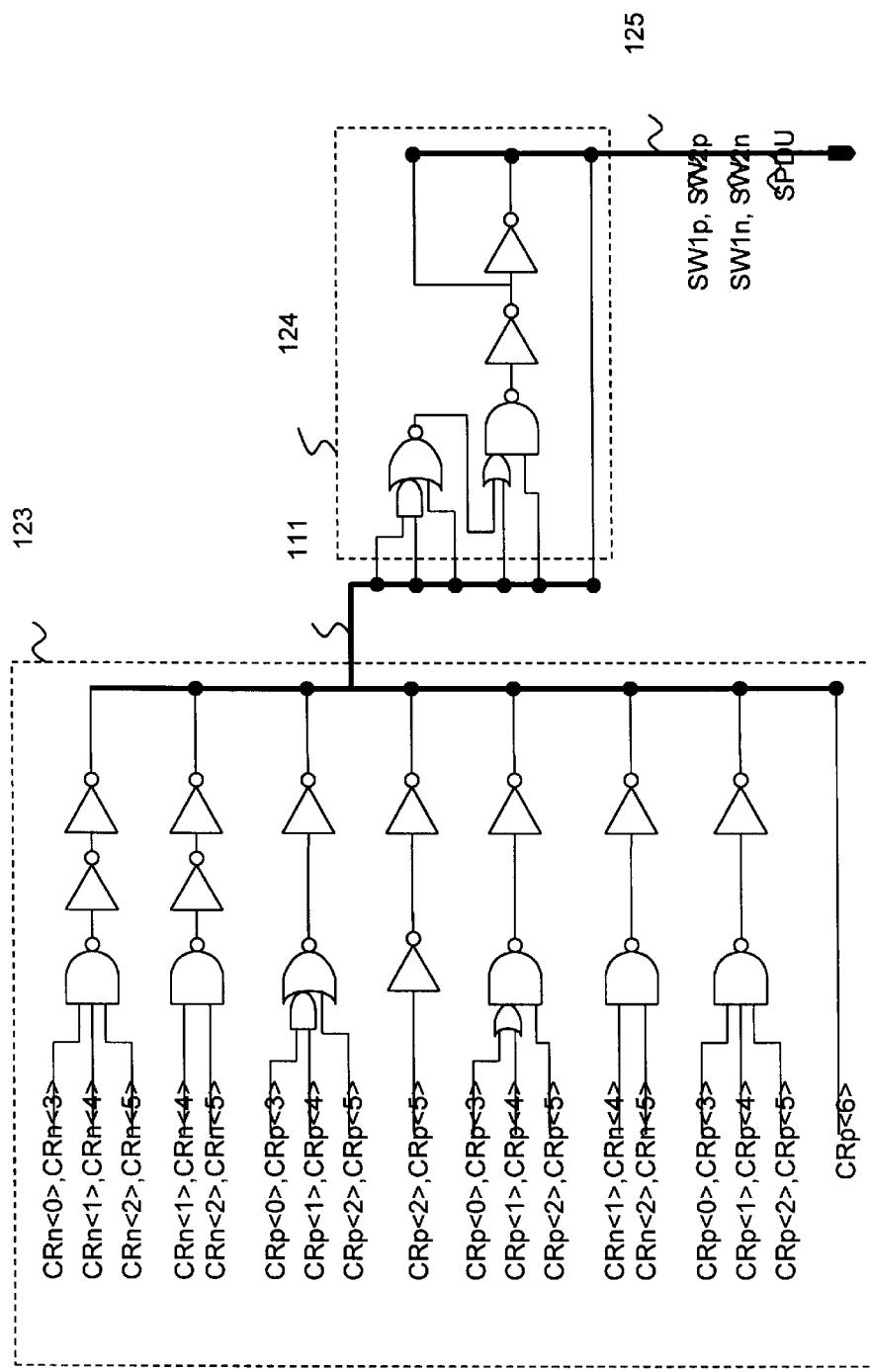
FIG. 6 is a schematic of the redundant address decoding and control logic circuitry.

FIG. 6 shows in detail the redundant predecoder circuitry 123 and the switching block decoder 124. The redundant predecoder circuitry 123 shown in FIG. 6 illustrates the predecoding of addresses signals CRn<0:6> and CRp<0:6>, but it is to be understood that the same type of circuit is used for the remaining redundant addresses signals CRn<0:13> and CRp<0:13>. Addresses CRn<0:6> and CRp<0:6> are predecoded using logic gates and inverters as known in the art to generate redundancy predecoding signals, generically referred to in FIGS. 2 and 4 as the redundancy control block signal 111 (signal 111 is shown as a multibit bus in FIG. 6, and it should be understood that this signal actually consists of all the predecoded redundant address signals generated by the redundant address predecoding logic also shown in FIG. 6). The redundancy control block signal 111 comprises the predecoded redundant address information that will be further decoded by the switching block decoder 124 for activating the switches 126 and 128 in the switching unit 112. Block decoder 124 shown in FIG. 6 decodes the redundancy control signal 111 generating the switch signal 125 comprising four signals for controlling the switches 126 and 128 (signals SW1p, SW2p, SW1n and SW2n), as well as the signals for controlling the pull down units (PDU) 127 (signals SPDU). The switch signal 125 is provided to the switching unit 112 for activating the appropriate connections between the global search and data lines and the corresponding non-faulty local search and data lines.

Figure 7:
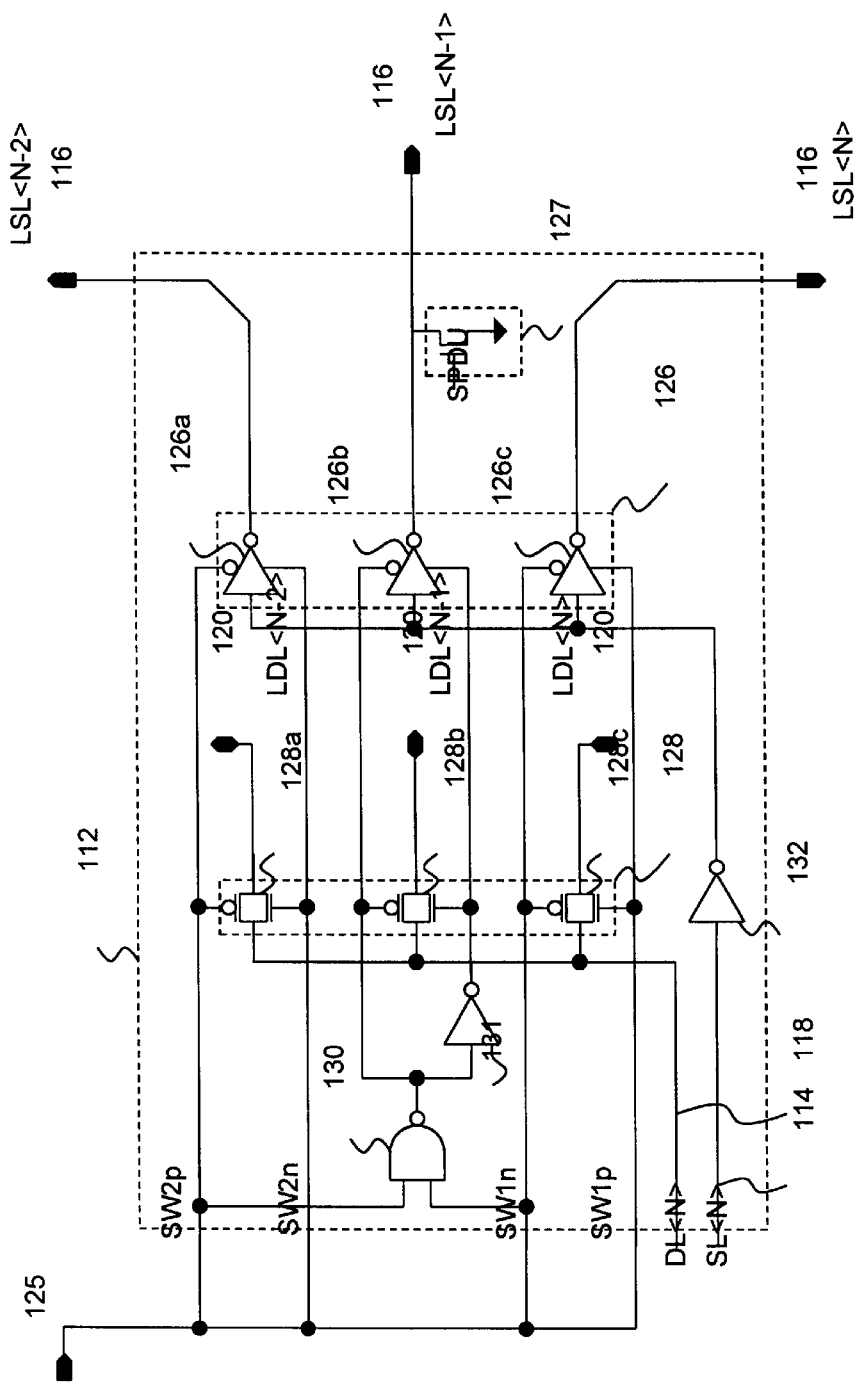
FIG. 7 is a schematic of the search and data line switching unit according to the invention.

FIG. 7 illustrates in more detail the switching unit 112 associated with one pair of search lines and one pair of data lines, previously described in FIG. 2. According to an embodiment of the invention, the discrete switches 126a, 126b and 126c are provided for connecting the global data line 118 DL<N> to the three possible local data lines 120 LDL<N-2:N> as described with reference to FIG. 3. In addition switches 128a, 128b, and 128c are provided for connecting the global search line 114 SL<N> to the local search lines 116 LSL<N−2:N>. Only one global search line SL<N> and one global data line DL<N> and their associated local lines are shown but it will be understood that similar groups of switches 126 and 128 would be provided for other global search lines and data lines such as SL<N> and DL<N> for example. Furthermore, the local search line LSL<N−1> 116 also has a pull-down unit PDU 127 for disabling defective the local search line. As previously mentioned with reference to FIG. 3, switches 126 and 128 normally transfer data between the global lines and local lines one position to the right. As a result, the pull-down unit associated with this switch unit 112 shown in FIG. 7 is connected to LSL<N−1> 116. A pull-down unit associated with LSL<N> is located in an adjacent switch unit 112 below the switch unit shown in FIG. 7 (or to the right of the leftmost switch unit shown in FIG. 2). Similarly, a pull-down unit associated with LSL<N−2> is be located in an adjacent unit 112 above the switch unit shown in FIG. 7.

The operation switch unit 112 of FIG. 7 will now be described. The switch unit 112 receives decoded redundant address routing signals 125 SW1p, SW2p, SW1n, SW2n and SPDU from the block decoder 124 (FIG. 6). These decoded routing signals control both groups of switches 128a, 128b, 128c as well as 126a, 126b, 126c. In other words, the redundant decoding information controls both the search and data path simultaneously. The decoding signals perform a one-of-three selection between switches 128a, 128b, 128c and a simultaneous one-of-three selection between switches 126a, 126b, 126c. For example, in case no defective elements exist in the memory segment associated with the switch unit 112 shown in FIG. 7, then pass gate 128c is activated to allow read/write data to be transferred between global data line DL<N> and local data line LDL<N> both being adjacent to and one position below (one position to the right in FIG. 2) the location of global data line DL<N>. Simultaneously, through the control of the same signals decoding signals SW1n and SW1p, tri-state buffer 126c passes search data from the global search line SL<N> via inverter 128 onto local search line LSL<N> also located adjacent to and one position below (one position to the right in FIG. 2) the global search line SL<N>. In case one defective memory element associated with DL<N> and SL<N> is detected during testing, then local data line LDL<N> and local search line LSL<N> must be switched out of the path of the global data and search lines DL<N> and SL<N>. As a result, decoding signals SW1n and SW1p disable pass gate 128c and tri-state buffer 126c, and instead activate pass gate 128b and tri-state buffer 126b thereby switching the path of read/write data between DL<N> and LDL<N−1> and the path of search data between SL<N> and LSL<N−1>. Simultaneously, a pull-down unit 127 associated with LSL<N> (not shown in FIG. 7 but identical to the pull-down unit 127 shown in FIG. 7) disables the defective local search line LSL<N>. If another defective element is detected before the N-th location, then the N-th location global read/write data and search data will be shifted two positions as described with reference to FIG. 3. With reference to FIG. 7, transfer gate 128a would therefore be enabled and tri-state buffer 126a would also be enabled and search data on global search line SL<N> would be switched to LSL<N−2> and read/write data on global data line DL<N> would be switched to LDL<N−2>.

For purposes of tight pitch control and high switching speed, it is desirable to have the redundancy circuitry illustrated in FIG. 4 occupy as little space as possible. In addition, the block decoder 124 is common to each group of switches 126 as shown in FIG. 2. Although transfer gates can also be used for transferring search data onto the local the search lines, tri-state output buffers 128 are preferred. Additionally the switching unit 112 includes a pull-down unit (PDUs) 127 preferably implemented with NMOS transistors connected to each local search line as shown in FIG. 7. The pull-down unit 127 receives a decoding signal SPDU from the block decoder 124. The presence of PDU 127 ensures that invalid search results are not reported by the array 100, by disabling the defective local search line and reporting a "don't care" state for the search operation with the associated defective location. The dedicated switching logic block 124 allows simultaneous data and search path access while minimizing the area dedicated to switching.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A content addressable memory having a column redundancy system for replacing defective memory elements with redundant memory elements, said content addressable memory being segmented into a plurality of memory arrays, each of said memory arrays comprising:

a plurality of columns of memory elements;

a predetermined number of redundant columns of memory elements;

a local search data path comprising a plurality of local search data lines coupled to said columns of memory elements;

a local read/write data path comprising a plurality of local read/write data lines coupled to said memory elements;

a redundancy control block; and a switching block for selectively coupling said local search data path and said local read/write data path to respective global search data path and global read/write data path in response to control signals provided by said redundancy control block, said switching block switching global data destined for an associated local data path to an adjacent local data path in the event a defective column is detected.

2. The content addressable memory system of claim 1, wherein the redundancy control block includes means for generating the control signals in accordance with the determined defective column.

3. The content addressable memory system of claim 1, wherein the adjacent local data path comprises non-defective memory elements.

4. The content addressable memory system of claim 1, further including pull-down units operatively connected to and controlled by the switching block, each pull-down unit associated with one of the plurality of search data lines for maintaining a predetermined signal on the local search line connected to a defective column.

5. The content addressable memory system of claim 1, wherein each of the pull-down units include at least one transistor having its source connected to a power supply, its drain connected to a search data line and its gate operatively connected to and controlled by the switching block.

6. The content addressable memory system of claim 1, wherein the switching block includes a fuse for programming the address of the local data path, the local data path including at least a defective memory element, and for redirecting global data destined for the local data path to an adjacent local data path, the adjacent local data path including a non-defective memory element.

* * * * *